Dec. 1, 1970 TAKESHI TERASAKI 3,544,395

SILICON P-N JUNCTION DEVICE AND METHOD OF MAKING THE SAME

Filed Nov. 15, 1966 3 Sheets-Sheet 1

Takeshi Terasaki,
INVENTOR

BY Wenderoth, Lind and Ponack,
ATTORNEYS

SILICON P-N JUNCTION DEVICE AND METHOD OF MAKING THE SAME

Filed Nov. 15, 1966 3 Sheets-Sheet 2

Takeshi Terasaki

INVENTOR

BY Wenderoth, Lind and Ponack

ATTORNEYS

Takeshi Terasaki

INVENTOR

BY Wenderoth, Lind and Ponack

ATTORNEYS

United States Patent Office 3,544,395

Patented Dec. 1, 1970

3,544,395

SILICON P-N JUNCTION DEVICE AND METHOD OF MAKING THE SAME

Takeshi Terasaki, Kyoto-shi, Japan, assignor to Matsushita Electric Industrial Co., Ltd., Osaka, Japan Filed Nov. 15, 1966, Ser. No. 594,601
Claims priority, application Japan, Nov. 30, 1965, 40/74,567
Int. Cl. H01l *3/12*
U.S. Cl. 148—33 5 Claims

ABSTRACT OF THE DISCLOSURE

A silicon p-n junction device comprising a silicon wafer having an etch pit density greater than $10^3$/cm.$^2$, an alloy dot mounted on a surface thereof, an interposed recrystallization layer between said alloy dot and said silicon wafer and a diffusion layer between said recrystallization layer and silicon wafer.

This invention relates to a novel silicon p-n junction device which is prepared by an and alloy-diffusion process and which has a low reverse current, a high breakdown voltage and a high resistance to mechanical damage. More particularly, the invention relates to a method of producing, in a high production yield, a silicon p-n junction device characterized by the above desired properties.

It has been well known that silicon p-n junction devices have many applications for use in electronic devices such as many kinds of transistors, rectifier elements, capacitance elements and photovoltaic cells. Recently much attention has been paid to variable capacitance diodes, especially hyper abrupt junction variable capacitance diode made from a silicon p-n junction. Usually a silicon p-n junction is prepared by an alloying process, an alloy diffusion process, a diffusion process or an epitaxial process. This invention contemplates to improve the production yield of silicon p-n junction devices prepared by an alloy diffusion process. It is difficult, in the preparation of conventional silicon p-n junctions by an alloy diffusion process, to obtain a low reverse current, a high breakdown voltage and a high resistance to mechanical damage. In addition, in the prior art alloy diffusion processes, it is difficult to control an area of p-n junction. Therefore, silicon p-n junction devices with entirely satisfactory properties are manufactured only in a low production yield.

It is an object of this invention to provide a silicon p-n junction device having a low reverse current, a high breakdown voltage and a high resistance to mechanical damage.

It is another object of the invention to provide a method of producing, in a high production yield, a silicon p-n junction device with entirely satisfactory properties.

More details of the invention will be apparent from the following description taken together with the accompanying drawings in which:

FIG. 1*a* is a cross-sectional view of a conventional silicon p-n junction.

FIG. 1*b* is a cross-sectional view of a silicon p-n junction in acordance with the present invention.

Figure 4A:
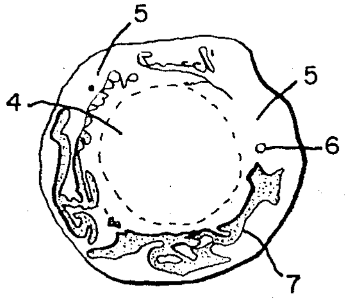
Figure 4B:
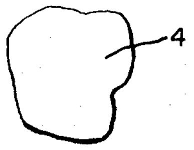

FIGS. 4*a* and 4*b* are views of a silicon p-n junction comprising a silicon crystal having a low etch pit density and a high etch pit density, respectively, after electrolytic etching.

Figure 5:
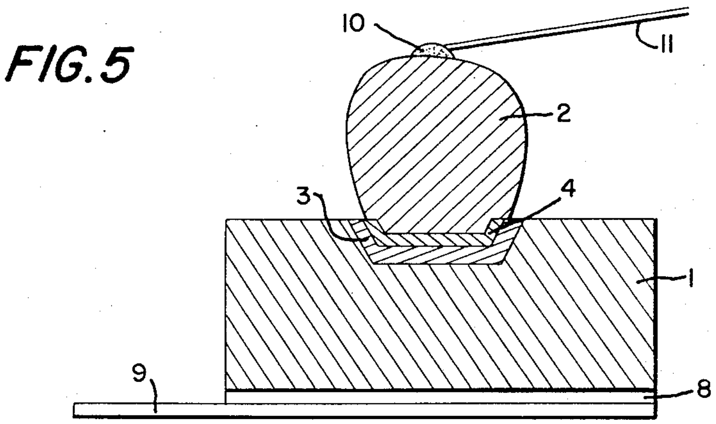

FIG. 5 is a view, partly in section and partly in elevation, of a variable capacitance diode according to the present invention.

Figure 6:
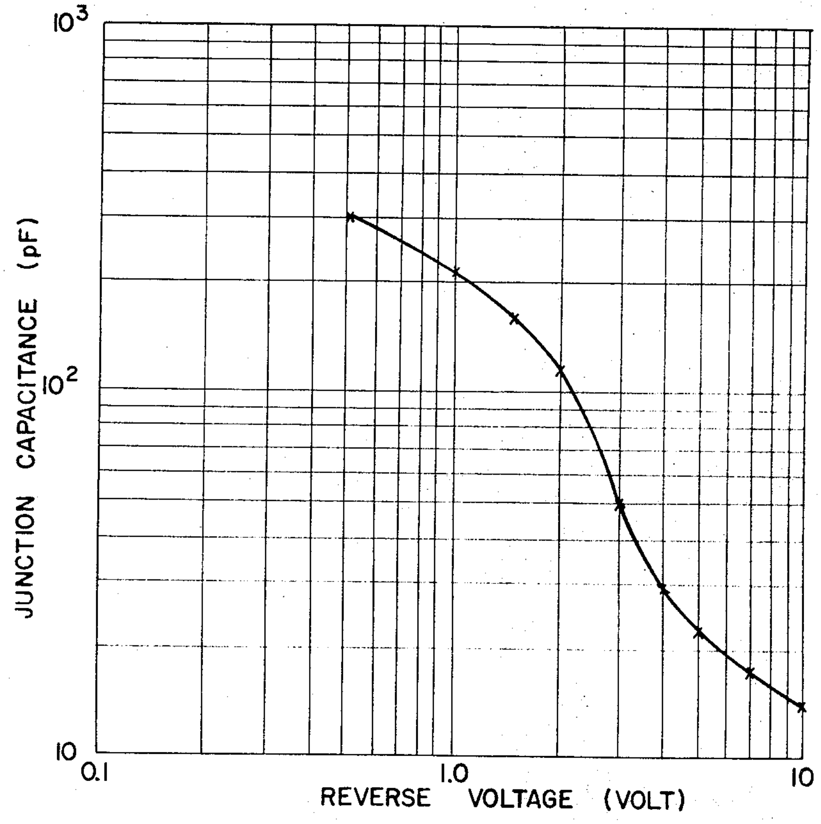

FIG. 6 is a graphical showing of the characteristics of capacitance as a function of reverse bias voltage.

Figure 1A:
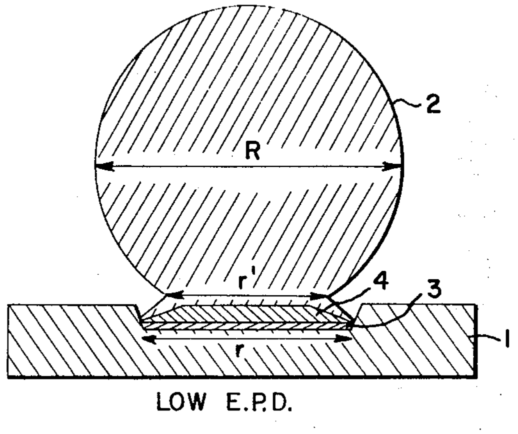

Referring to FIG. 1*a*, a silicon p-n junction comprises, for example, a p-type silicon crystal 1, an alloy dot 2, an interposed layer consisting of a diffusion layer 3 and recrystallization layer 4, which is obtained by heating a combination of p-type silicon 1 and an alloy dot 2 in a way contemplated by the invention. The combination is heated up to 400° C. to 900 C. in air at a pressure of $10^{-2}$ to $16^{-6}$ mm. Hg, whereby the alloy dot 2 is wetted to the silicon crystal 1 because the alloy dot has a melting point of 300° to 900° C. The wetted combination of alloy dot and silicon is heated in a non-oxidizing atmosphere such as hydrogen or argon at 900° to 1100° C. During heating at 900° to 1100° C., the melted alloy dots eats the silicon in a solid state and dissolves the silicon to an amount corresponding to the solubility at the heating temperature. A short heating time at 900° C. to 1100° C. does not appreciably form a diffusion layer but a long heating time at that temperature produces a diffusion layer 3. A sufficient time for diffusion layer formation varies with the heating temperature. An alloy process, involves the formation of a silicon p-n junction having only the recrystallization layer 4, while an alloy diffusion process involves the formation of a silicon p-n junction having both the recrystallization layer 4 and the diffusion layer 3.

The alloy dot 2 comprises active metals to form a p-n junction. The active metals are necessary for producing a recrystallization layer and diffusion layer and vary with the characteristic of silicon 1, i.e. p-type or n-type. A silicon p-n junction with a hyper abrupt distribution of impurities is prepared by employing a p-type silicon crystal and an alloy dot comprising, as active metals, a III Group metal and a V Group metal in the Periodic Table. The dissolved silicon in the alloy dot segregates during cooling and forms a recrystallization layer 4.

Figure 1B:
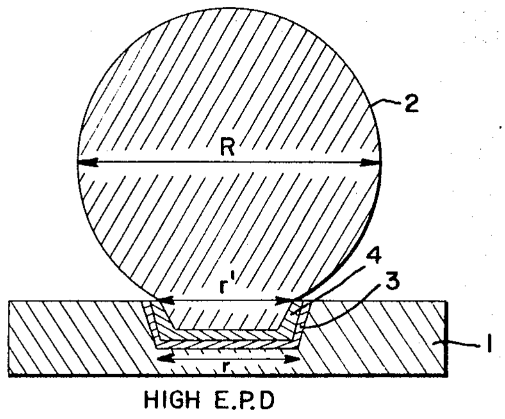

According to the present invention, the etch pit density of the silicon crystal has a great effect on the formation of silicon p-n junction. The etch pit is usually revealed by silicon p-n junction. The etch pit is usually revealed by etching a single crystal of semiconductor, metal or alloy, and is known to represent a dislocation of the single crystal. The etch pit density decreases as the crystal becomes more perfect. Referring to FIG. 1*a* which shows a silicon p-n junction comprising a silicon crystal with an etch pit density lower than $10^3$/cm.$^2$, a part of the silicon eaten by the alloy dot spreads. On the other hand, the eaten part of the silicon p-n junction is narrow, as shown in FIG. 1*b*, when a silicon crystal with an etch pit density higher than $10^3$/cm.$^2$ is employed.

A silicon crystal having an etch pit density higher than $10^3$/cm.$^2$ produces a recrystallization layer in a box-type form having a narrow eaten part and a large depth. According to the present invention, the etch pit density of silicon determines a spreading ratio which is defined as the ratio of the diameter of interposed recrystallization layer to the diameter of alloy dot. An etch pit density more than $10^3/cm.^2$ frequently results in a ratio ranging from 0.4 to 0.6 and an etch pit density less than $10^3/cm.^2$ has a tendency to result in a ratio ranging from 0.6 to 1.0.

Figure 2:
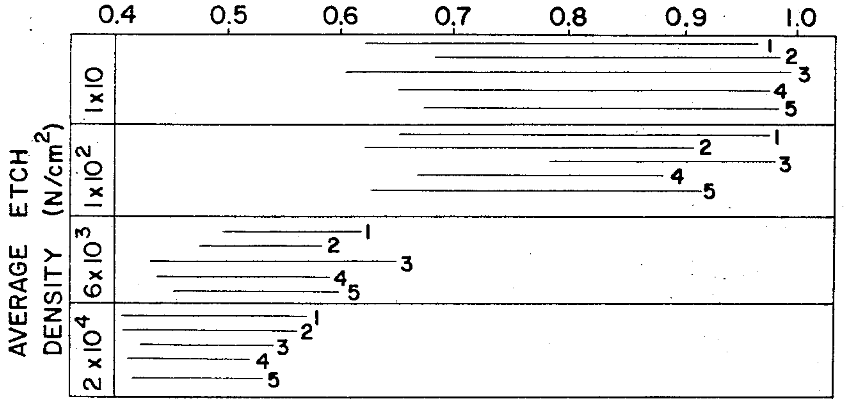
FIG. 2 is a graph illustrating the relation between spreading ratio defined hereinafter and etch pit density of silicon as a function of atmosphere.

Silicon p-n junction devices are prepared by employing silicon wafers with various etch pit densities and alloy dots consisting of Sn, Sb and Al in a weight proportion Sn:Sb:Al=300~800:25~60:1 in various atmospheres. FIG. 2 shows a relation between the etch pit density and the spreading ratio of resultant devices. Referring to FIG. 2, reference character 1 designates argon gas with removal of moisture and oxygen contained therein, as an atmosphere, and 2, 3, 4 and 5 designate nitrogen gas without treatment for removal of oxygen contained therein, a mixture of hydrogen and nitrogen with removal of moisture contained therein, pure nitrogen, and hydrogen with removal of moisture, respectively. Starting gases are commercial ones which contain a minor amount of moisture and oxygen. The purification of these gases is carried out in a per se well known method in connection with the removal of moisture and oxygen.

FIG. 2 shows that an etch pit density more than $10^3/cm.^2$ produces a spreading ratio of 0.4 to 0.6 regardless of the atmospheres employed. A spreading ratio less than 0.6 can be obtained with silicon having an etch pit density more than $10^3/cm.^2$ even when the composition of the alloy dot varies appreciably. It has been discovered according to the present invention that a spreading ratio less than 0.6 results in a silicon p-n junction device having a low reverse current and a high resistance to mechanical damage as explained hereinafter.

Figure 3:
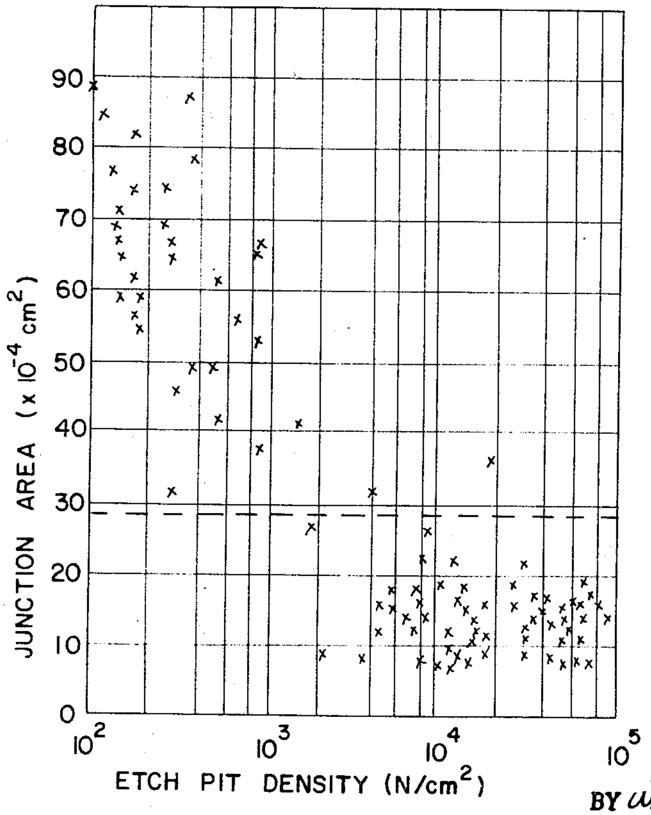
FIG. 3 is a graph showing the relation between etch pit density of silicon crystal and junction area or spreading ratio hereinafter identified.

Referring to FIG. 3 showing the relation between the said etch pit density and a junction area of silicon p-n junction made of an alloy dot comprising Sb, Sn and Al in a way similar to that described above, the junction area decreases with an increase in the etch pit density and becomes nearly constant at an etch pit density higher than approximately $1 \times 10^3/cm.^2$. The constant junction area is preferable for obtaining a close tolerance of aimed properties of a resultant silicon p-n junction device, such as capacitance, photovoltaic power and rectifying power. According to the present invention a high production yield of silicon p-n junction devices can be achieved by employing a silicon wafer with an etch pit density higher than $10^3/cm.^2$, regardless of the compositions of the combined alloy dot. It has been believed heretofore that the junction area can be controlled by heating atmospheres. The etch pit density of the silicon crystal, however, has a greater effect on the junction area than the heating atmosphere as shown in FIG. 3.

Reasons why a high density of etch pit of silicon produces such a low spreading ratio may be explained as follows. A spreading of the eaten part may depend upon the interface tension between silicon wafer and molten alloy dot, the surface tension of alloy dot and the surface tension of silicon wafer. The interface tension and the surface tension of silicon may vary predominantly with the etch pit density of the silicon, i.e. a dislocation density of the silicon crystal. The variation in the etch pit density is apparently related to the spreading of eaten part. A wide junction area with a thin marginal part produces a high strain caused by the difference between volume contractions of the silicon wafer and alloy dot during cooling. The high strain may result in a weak adhesion between the silicon and alloy dot after electrolytic etching hereinafter explained.

Silicon p-n junctions so produced are required to undergo electrolytic etching for controlling the area of the p-n junction and/or for eliminating contaminations which segregate at the marginal parts of the p-n junctions. The contamination is responsible for a high reverse current and a low breakdown voltage. Any electrolyte can be applied for the electrolytic etching. For example, an aqueous solution of HF and $H_3PO_4$ etches a silicon p-n junction in such manner that the thickness of the etched part is easily controlled and the contaminations are preferentially removed. The etching process plays an important role on a production yield of silicon p-n junction devices with a low reverse current and a high breakdown voltage.

To reveal the recrystallization layer of silicon p-n junctions etched by aqueous solution of HF and $H_3PO_4$, alloy dots are dissolved off by mercury in a per se well known manner. Microphotographic observations thereof are shown in FIGS. 4*a* and 4*b* with respect to etch pit density of silicon wafers. An etch pit density higher than $10^3/cm.^2$ produces a narrow recrystallization layer 4 characterized by a plain surface as shown in FIG. 4*b*; on the other hand, an etch pit density lower than $10^3/cm.^2$ forms a spread-out recrystallization layer as shown in FIG. 4*a*. Referring to FIG. 4*a*, reference character 4 designates a recrystallization layer which contacts with an alloy dot and 5 is a recrystallization layer obtained by the spreading of the alloy dot during heat treatment. The recrystallization layer 5 is heterogeneously etched and has various etch spots 6 and etch islets 7 which cause a high reverse current and a low breakdown voltage of resultant silicon p-n junction devices.

The advantageous merits of silicon crystals with an etch pit density higher than $10^3/cm.^2$ cannot be impaired by employing alloy dots in various compositions comprising at least one metal selected from the III and/or V group of the Periodic Table. Excellent silicon p-n junction devices also can be prepared by employing a silicon crystal with an etch pit density higher than $10^3/cm.^2$ and an alloy dot comprising at least a combination of metals selected from the III Group of the Periodic Table and the V group of the Periodic Table. Following are preferable compositions of alloy dots to form silicon p-n junction devices with a p-type silicon crystal having an etch pit density higher than $10^3/cm.^2$.

TABLE 1

| Carrier constituent | Active constituent | Preferable weight proportion |
|---|---|---|
| Sn | Sb and Al | Sn:Sb:Al=300~800:25~60:1 |
| Pb | Sb and Al | Pb:Sb:Al=300~800:25~60:1 |
| Sn | Bi and Al | Sn:Bi:Al=300~800:30~100:1 |
| Pb | Bi and Al | Pb:Bi:Al=300~800:30~100:1 |
| Ag | Sb and Al | Ag:Sb:Al=100~500:25~60:1 |
| Au | Sb and Al | Au:Sb:Al=100~500:25~60:1 |
| In | In | |
| Al | Al | |
| Sn | Sb and Ga | Sn:Sb:Ga=300~800:100~40:1 |
| Sn | Sb and In | Sn:Sb:In=300~800:20~1:1 |
| Pb | Sb and In | Pb:Sb:In=300~800:20~1:1 |
| Sn and Au | Sb and In | Sn:Au:Sb:In=300~800:3~8:20~1:1 |
| Sn | Bi and In | Sn:Bi:In=300~800:40~10:1 |
| Sn and Ag | Bi and In | Sn:Ag:Bi:In=300~800:3~8:40~10:1 |
| Sn | As and Al | Sn:As:Al=300~800:1~0.1:1 |
| Pb | As and Al | Pb:As:Al=300~800:1~0.1:1 |
| Sn and Au | As and Ga | Sn:Au:As:Ga=300~800:3~8:1~0.1:1 |
| In | As and Ga | In:As:Ga=300~800:1~0.1:1 |
| Pb | As and Ga | Pb:As:Ga=300~800:1~0.1:1 |
| Sn | As and In | Sn:As:In=300~800:1~0.05:1 |
| Pb | As and In | Pb:As:In=300~800:1~0.05:1 |
| Sn and Au | As and In | Sn:Au:As:In=300~800:3~8:1~0.05:1 |
| Sn | P and Al | Sn:P:Al=300~800:1~0.1:1 |
| Sn and Au | P and Ga | Sn:Au:P:Ga=300~800:3~8:1~0.1:1 |
| Sn and Ag | P and Ga | Sn:Ag:P:Ga=300~800:3~8:1~0.1:1 |
| In | P and Ga | In:P:Ga=300~800:1~0.1:1 |

Active constituents referred herein are metals to control the semiconductive characteristics of the silicon crystal in view of the per se well known semiconductor principle. Carrier metals referred herein have no effects on the semiconductive characteristics of the silicon crystal and control the mechanical properties such as ductility and thermal expansion of alloy dot.

A silicon crystal wafer having an etch pit density higher than $10^3/cm.^2$ can be prepared in a per se well known method. High purity silicon crystal is doped with impurities necessary for obtaining p-type or n-type semiconductivity of silicon having a desired electrical conductivity. A well known pulling method and/or zone refining process may be employed for producing the silicon crystal. An ingot of silicon single crystal is sliced into several plates for testing distribution of etch pit density. The sliced plates are etched by aqueous solution comprising HF, $HNO_3$ and $CH_3COOH$ to reveal etch pits corresponding to dislocations of silicon crystal. Desired silicon wafers can be obtained by dividing the sliced plates having etch pit density higher than $10^3$/cm.$^2$.

Silicon p-n junctions according to this invention can be applied for manufacturing entirely satisfactory silicon p-n junction devices such as many kinds of transistors, rectifiers, photovoltaic cells and capacitors including variable capacitance diodes. The following specified devices are illustrated as examples of this invention and should not be construed as limitative.

P-type silicon wafers in a form of a square 2 mm. x 2 mm., and a thickness of 100$\mu$ are obtained by lapping, cleaning, chemical etching, rinsing with deionized water and drying in a per se well known manner. The wafers have an electrical resistance of 20 ohm-cm. Alloy dots consists of Sn, Sb and Al in a weight proportion $$Sn:Sb:Al=300\sim800:25\sim60:1$$

and have a diameter of 840$\mu$ to 1190$\mu$. Wetting is carried out by heating the alloy dot on the silicon wafer under reduced pressure of $10^{-4}$ mm. Hg at 600° C. for 20 minutes. Thereafter a combination of dots and silicon wafers is heated in $H_2$ up to 1000° C. and maintained at that temperature for 15 to 30 minutes for achieving alloy diffusion. Thereafter, a hyper abrupt junction variable capacitance silicon diode is produced by contacting electrodes in a per se conventional way.

Referring to FIG. 5, reference number 3 designates a diffusion layer and 4 designates a recrystallization region formed between silicon wafer 1 and alloy dot 2. The silicon wafer 1 is provided with molybdenum electrodes 9 by using an Al-Si eutectic solder 8. A silicon p-n junction is completed by electrolytic etching and is coated with a silicon wax (e.g. commercially available Silox Pergan-C). Lead wire 11 is applied to said alloy dot 2 by means of a conventional solder 10.

The characteristics curve of capacitance and reverse voltage of so-produced hyper abrupt junction variable capacitance silicon diode is shown in FIG. 6, wherein capacitance and reverse voltage are plotted in a logarithmic scale.

Table 2 shows a number of samples satisfying various tests in connection with the etch pit density of silicon. Silicon wafers are divided into two groups having an average etch pit density of $5\times10^3$/cm.$^2$ and an average etch pit density of 10/cm.$^2$. Each group of silicon wafer makes first 1700 variable capacitance diodes in a way described above. Electrical characteristics of resultant diodes are required to satisfy the following specification: (1) Breakdown voltage is higher than 30 v., (2) capacitance at 1 v. ranges from 190 to 210 pf., (3) reverse current at —10 v. is less than 200 m$\mu$a. and (4) Q factor is higher than 40 at 550 kc. Table 2 indicates clearly that a production yield is 67.8% for silicon wafers having an average etch pit density of $5\times10^3$/cm.$^2$ and is 12.7% for silicon wafers having an average etch pit density of 10/cm.$^2$. The characteristics of V–I curves of diodes with or without electrolytic etching are greatly improved by employing silicon wafers with average etch pit density of [$5\times10^3$/cm.$^2$]. A hard breakdown voltage referred to Table 2 is defined as a voltage at which a current increases sharply and a soft breakdown voltage is defined as a voltage at which a current increases gradually in the V–I characteristic curve of the diode. A high hard breakdown voltage is preferable for the p-n junction devices.

Silicon wafers with an etch pit density of $5\times10^3$/cm.$^2$ reduce the number of diodes which lose alloy dots by peeling during assembling and ultrasonic cleaning, and have a high resistance to mechanical damages.

TABLE 2

| Specifications | Number of samples corresponding to specifications: A group of high E.P.D. average $5\times10^3$/cm.$^2$ | A group of low E.P.D. average $5\times10$/cm.$^2$ |
|---|---|---|
| Total samples | 1,700 | 1,700 |
| Samples punched through | 196 | 5 |
| Samples peeled off | 5 | 192 |
| Capacitance less than 190 pf | 102 | 156 |
| Capacitance higher than 190 pf | 1,397 | 1,347 |
| Hard breakdown (100~140 v.) | 1,172 | 456 |
| Soft breakdown (60~100 v.) | 206 | 533 |
| Soft breakdown (30~60 v.) | 12 | 211 |
| Soft breakdown (0 to 30 v.) | 7 | 147 |
| Samples failed in etch | 8 | 36 |
| Samples peeled off by ultrasonic cleaning | 11 | 274 |
| Sample coated with silicon wax after etching | 1,378 | 1,037 |
| Hard breakdown (100~140 v.) | 1,065 | 72 |
| Soft breakdown (60~100 v.) | 291 | 196 |
| Soft breakdown (30~60 v.) | 17 | 644 |
| Soft breakdown (0~30 v.) | 5 | 125 |
| Reverse current (—10 v.): | | |
| 200 m$\mu$a.> | 1,173 | 252 |
| 200 m$\mu$a.~1$\mu$a | 152 | 271 |
| 1~10$\mu$a | 32 | 308 |
| 10~100$\mu$a | 17 | 157 |
| >100$\mu$a | 4 | 49 |
| Production yield, percent | 67.8 | 12.7 |

NOTE.—E.P.D. represents etch pit density.

Repetition of electrolytic etching increases the number of diodes having a reverse current less than 200 m$\mu$a. when silicon wafers with an etch pit density of $5\times10^3$/cm.$^2$ are employed whereas the repetition does not increase the number when silicon wafers with etch pit density of 10/cm.$^2$ are employed. No improvement in the reverse current with respect to the repetition is attributed to the fact that the etch spots 6 and islets 7 appear in the widely spread part 5 in FIG. 4*a* when silicon wafer with an etch pit density of 10/cm.$^2$ is used.

It will be understood from Table 3 illustrating the distribution of reverse current that a low reverse current of resultant diodes is obtained by employing silicon wafers with an etch pit density of $5\times10^3$/cm.$^2$. In connection with the reverse currents less than 200 m$\mu$a. in Table 2, the most probable current is 1 to 20 m$\mu$a. for silicon wafers having an etch pit density of $5\times10^3$/cm.$^2$ and is 60 m$\mu$a. to 100 m$\mu$a. for silicon wafers having an etch pit density of 10/cm.$^2$.

TABLE 3

| Specification of reverse current | Number of samples satisfying specific reverse current: A group of high E.P.D. average $5\times10^3$/cm.$^2$ | A group of low E.P.D. average 10/cm.$^2$ |
|---|---|---|
| 1 m$\mu$a> | 24 | 0 |
| 1~10 m$\mu$a | 573 | 16 |
| 10~20 m$\mu$a | 399 | 11 |
| 20~40 m$\mu$a | | |
| 20~40 m$\mu$a | 93 | 9 |
| 40~60 m$\mu$a | 40 | 26 |
| 60~80 m$\mu$a | 117 | 81 |
| 80~10 m$\mu$a | 16 | 38 |
| 100~150 m$\mu$a | 7 | 26 |
| 150~200 m$\mu$a | 4 | 45 |

What is claimed is:

1. A hyper abrupt junction variable capacitance silicon diode, comprising a silicon wafer having an etch pit density greater than $10^3$/cm.$^2$, throughout the bulk of the wafer, an alloy dot mounted on a surface thereof, an interposed recrystallization layer between the alloy dot and said silicon wafer, and a diffusion layer between said recrystallization layer and silicon wafer.

2. A hyper abrupt junction variable capacitance silicon diode according to claim 1, the spreading ratio of diameter of said interposed recrystallization layer to diameter of said alloy dot being less than 0.6.

3. A hyper abrupt junction variable capacitance silicon diode according to claim 2, said alloy dot containing as active constituents, at least one metal selected from the group consisting of B, Al, Ga, In, P, As, Sb and Bi and, as carrier constituents, at least one metal selected from the group consisting of Pb, Sn, Ag and Au.

4. A hyper abrupt junction variable capacitance diode according to claim 2, said alloy dot consisting of Sn, Sb and Al.

5. A hyper abrupt junction variable capacitance diode according to claim 4, said alloy dot consisting of Sn, Sb and Al in weight proportion of Sn:Sb:Al=300 to 800: 25 to 60:1.

References Cited

UNITED STATES PATENTS

| | | | |
|---|---|---|---|
| 2,847,336 | 8/1958 | Pankove | 148—179 X |
| 2,932,594 | 4/1960 | Mueller | 148—179 X |
| 2,943,005 | 6/1960 | Rose | 148—179 X |
| 3,009,841 | 11/1961 | Faust | 148—179 X |
| 3,075,892 | 1/1963 | John et al. | 148—179 X |
| 3,232,800 | 2/1966 | Mihara et al. | 148—179 |
| 3,323,957 | 6/1967 | Rose | 148—179 X |
| 3,416,979 | 12/1968 | Onuma et al. | 148—178 |

L. DEWAYNE RUTLEDGE, Primary Examiner

R. A. LESTER, Assistant Examiner

U.S. Cl. X.R.

148—332, 336, 177, 178, 179; 317—234